(12) United States Patent
Lu

(10) Patent No.: US 7,253,756 B2
(45) Date of Patent: Aug. 7, 2007

(54) METHOD AND DEVICE FOR DYNAMICALLY ACCELERATING ANALOG-TO-DIGITAL CONVERTER

(75) Inventor: Chih-Shiun Lu, Hsinchu County (TW)

(73) Assignee: Mstar Semiconductor, Inc., Hsinchu County (TW)

( * ) Notice: Subject to any disclaimer, the term of this patent is extended or adjusted under 35 U.S.C. 154(b) by 0 days.

(21) Appl. No.: 11/329,150

(22) Filed: Jan. 11, 2006

(65) Prior Publication Data
US 2006/0261995 A1    Nov. 23, 2006

(30) Foreign Application Priority Data
May 20, 2005    (TW) ................. 94116447 A

(51) Int. Cl.
*H03M 1/00* (2006.01)
(52) U.S. Cl. ...................................... 341/123; 341/155
(58) Field of Classification Search ................ 341/155, 341/122, 123
See application file for complete search history.

(56) References Cited

U.S. PATENT DOCUMENTS

| | | | | |
|---|---|---|---|---|
| 5,606,320 A | * | 2/1997 | Kleks ........................ | 341/161 |
| 5,691,720 A | * | 11/1997 | Wang et al. ................ | 341/143 |
| 5,745,066 A | * | 4/1998 | Hirooka et al. ............. | 341/155 |
| 5,944,940 A | * | 8/1999 | Toshima ................. | 156/345.29 |
| 6,040,868 A | * | 3/2000 | Jun ............................. | 348/448 |
| 6,232,905 B1 | * | 5/2001 | Smith et al. ................ | 341/155 |
| 6,414,659 B1 | * | 7/2002 | Park et al. ..................... | 345/63 |
| 6,597,370 B1 | * | 7/2003 | Lee ............................. | 345/660 |
| 6,826,247 B1 | * | 11/2004 | Elliott et al. ................ | 375/376 |
| 6,943,720 B2 | * | 9/2005 | Nakamori et al. .......... | 341/156 |
| 6,943,828 B1 | * | 9/2005 | Grimes et al. .............. | 348/194 |

\* cited by examiner

*Primary Examiner*—Peguy Jeanipierre
(74) *Attorney, Agent, or Firm*—Troxell Law Office, PLLC

(57) ABSTRACT

A method and a device for dynamically accelerating an analog-to-digital converter (ADC) are provided. The device for dynamically accelerating ADC is capable of detecting the sampling frequency and controlling the maximum conversion rate by boosting the current into the ADC such that the maximum conversion rate of the ADC is larger than or equal to the sampling frequency. The efficiency of the ADC is optimized.

8 Claims, 4 Drawing Sheets

METHOD AND DEVICE FOR DYNAMICALLY ACCELERATING ANALOG-TO-DIGITAL CONVERTER

BACKGROUND OF THE INVENTION

1. Field of the Invention:

The present invention generally relates to a method and a device for dynamically accelerating an analog-to-digital converter (ADC) and, more particularly, to a method and a device capable of detecting the sampling frequency and controlling the maximum conversion rate so as to dynamically accelerate the ADC.

2. Description of the Prior Art:

The analog-to-digital converter (ADC) is required for a liquid crystal display (LCD) to convert analog video signals into digital video signals, which are then output to a scaler in the LCD to accommodate the different format of the input video signal and the display.

Please refer to FIG. 1, which is a schematic diagram showing an ADC receiving an analog video signal. The ADC 110 converts and samples the analog video signal 115 so as to output a digital signal 117. The sampling frequency at which the ADC 110 samples the analog video signal 115 is determined by a clock signal 130. The clock signal 130 is generated by a phase-locked loop (PLL) 120 receiving a horizontal synchronization (H-sync) signal 135 in the LCD. The frequency of the H-sync signal 135 is equal to the horizontal scanning frequency of the LCD. The maximum conversion rate of the ADC 110 is a figure of merit when it comes to the performance of the ADC 110.

Generally, the maximum conversion rate of the ADC 110 has to be larger than or equal to the sampling frequency when the ADC 110 performs analog-to-digital conversion on the analog signal 115 such that the analog signal 115 can be converted into the digital signal 117. However, in some cases, when the resolution of the LCD is so high that the maximum conversion rate of the ADC 110 may be smaller than the sampling frequency, the LCD may suffer unsatisfactory quality. On the other hand, if the ADC 110 operates at the maximum conversion rate, it may result in poor ADC efficiency when the resolution of the LCD is low.

Therefore, there is need in providing a method and a device for dynamically accelerating an analog-to-digital converter (ADC), capable of detecting the sampling frequency and controlling the maximum conversion rate so as to dynamically accelerate the ADC.

SUMMARY OF THE INVENTION

It is a primary object of the present invention to provide a method and a device for dynamically accelerating an analog-to-digital converter (ADC) by detecting the sampling frequency and controlling the maximum conversion rate so as to optimize the efficiency of the ADC.

In order to achieve the foregoing object, the present invention provides a method for dynamically accelerating an analog-to-digital converter (ADC), the method comprising steps of: receiving a horizontal synchronization (H-sync) signal by using a phase-locked loop (PLL) so as to generate a clock signal; detecting the sampling frequency of the clock signal; determining whether the maximum conversion rate of the ADC is larger than or equal to the sampling frequency; and increasing the slew rate of the ADC when the maximum conversion rate is smaller than the sampling frequency such that the maximum conversion rate is larger than or equal to the sampling frequency.

Preferably, the maximum conversion rate is determined to be larger than or equal to the sampling frequency by using a look-up table (LUT).

Preferably, the slew rate is increased by boosting a current of the ADC.

Preferably, the slew rate is increased by switching to at least one of a plurality of shunt current sources so as to adjust a current of the ADC and control the slew rate.

The present invention discloses a device for dynamically accelerating an analog-to-digital converter (ADC), wherein a sampling frequency of the ADC is controlled by a clock signal generated by a phase-locked loop (PLL) receiving a horizontal synchronization (H-sync) signal, the device comprising: a frequency detecting circuit for detecting a frequency of the clock signal and outputting a detection signal; and a control unit for receiving the detection signal and outputting a current into the ADC.

Preferably, the control unit comprises: a look-up table (LUT) circuit for receiving the detection signal and outputting a control signal according to a look-up table (LUT); and a current boosting circuit for receiving the control signal and outputting the current into the ADC. Moreover, the current boosting circuit comprises: a plurality of shunt current sources, each comprising a current outlet coupled to the ADC; and a switch for receiving the control signal and determining whether each of the plurality of shunt current sources is to output a sub-current into the ADC. There is a predetermined ratio relationship among sub-currents from the shunt current sources.

The present invention further discloses a device for dynamically accelerating an analog-to-digital converter (ADC), wherein a sampling frequency of the ADC is controlled by a clock signal generated by a phase-locked loop (PLL) receiving a horizontal synchronization (H-sync) signal, the device comprising: a comparison circuit for receiving the clock signal and a reference signal so as to compare frequencies of the clock signal and the reference signal and output a control signal; and a current boosting circuit for receiving the control signal and outputting a current into the ADC.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention providing a method and a device for dynamically accelerating an analog-to-digital converter (ADC) can be exemplified by the preferred embodiments as described hereinafter.

Figure 1:
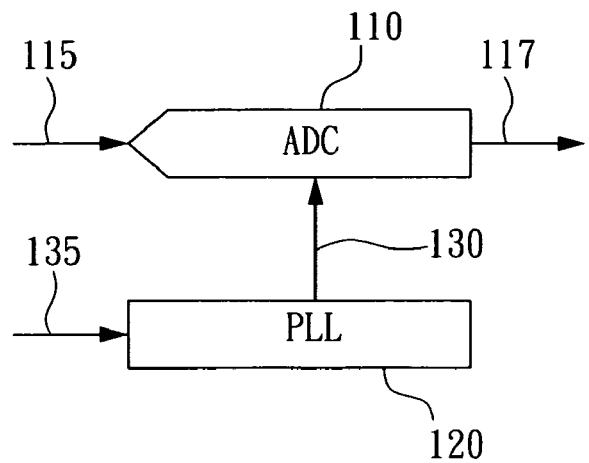
FIG. 1 is a schematic diagram showing an ADC receiving an analog video signal in the prior art.
Figure 2:
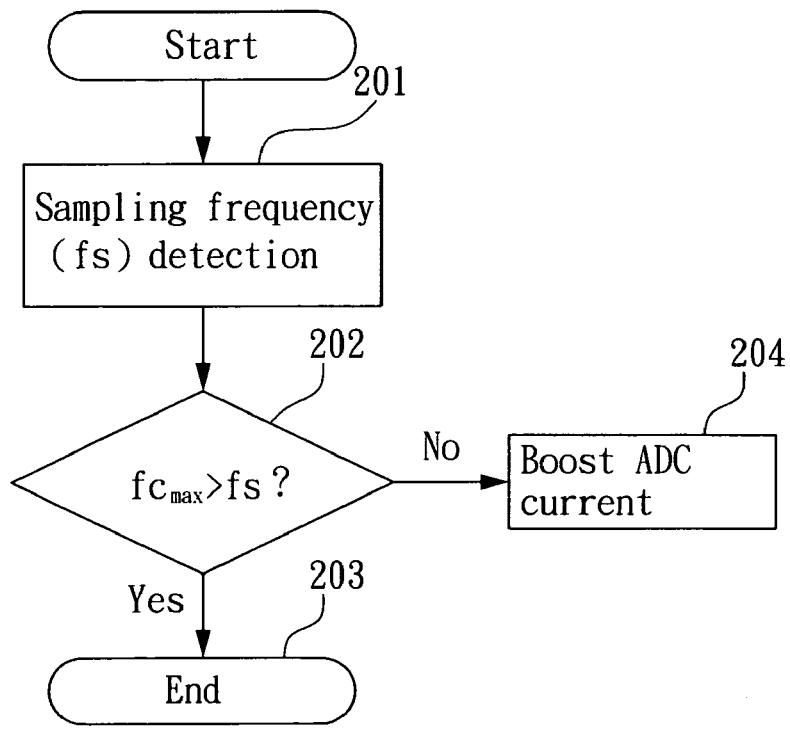
FIG. 2 shows a flow chart for dynamically accelerating an ADC according to the present invention.

Please refer to FIG. 2, which shows a flow chart for dynamically accelerating an ADC according to one embodiment of the present invention. In Step 201, a sampling frequency ($f_s$) of a clock signal generated by a phase-locked loop (PLL) receiving a horizontal synchronization (H-sync) signal is detected. The sampling frequency ($f_s$) changes with the resolution of the display. In Step 202, it is determined whether a maximum conversion rate ($f_{c,max}$) of the ADC is larger than or equal to the sampling frequency ($f_s$). Preferably, a look-up table (LUT) is utilized in Step 202.

If the maximum conversion rate ($f_{c,max}$) is larger than or equal to the sampling frequency ($f_s$), the procedure ends without adjusting the maximum conversion rate ($f_{c,max}$) of the ADC, as described in Step 203. However, in Step 204, the slew rate of the ADC is increased when the maximum conversion rate is smaller than the sampling frequency such that said maximum conversion rate is larger than or equal to the sampling frequency.

In this embodiment, the maximum conversion rate ($f_{c,max}$) of the ADC is enhanced by increasing the current in the ADC. It is because that the slew rate of the ADC is enhanced as the current supply in the ADC is increased. Those with ordinary skills in the art should note that the slew rate of the ADC is proportional to the current. When the slew rate of the ADC is enhanced, the voltage rise as a function of time is increased so that the ADC can perform conversion on analog signals with higher frequencies. In other words, when the current in the ADC is boosted, the maximum conversion rate of the ADC is enhanced.

Figure 3A:
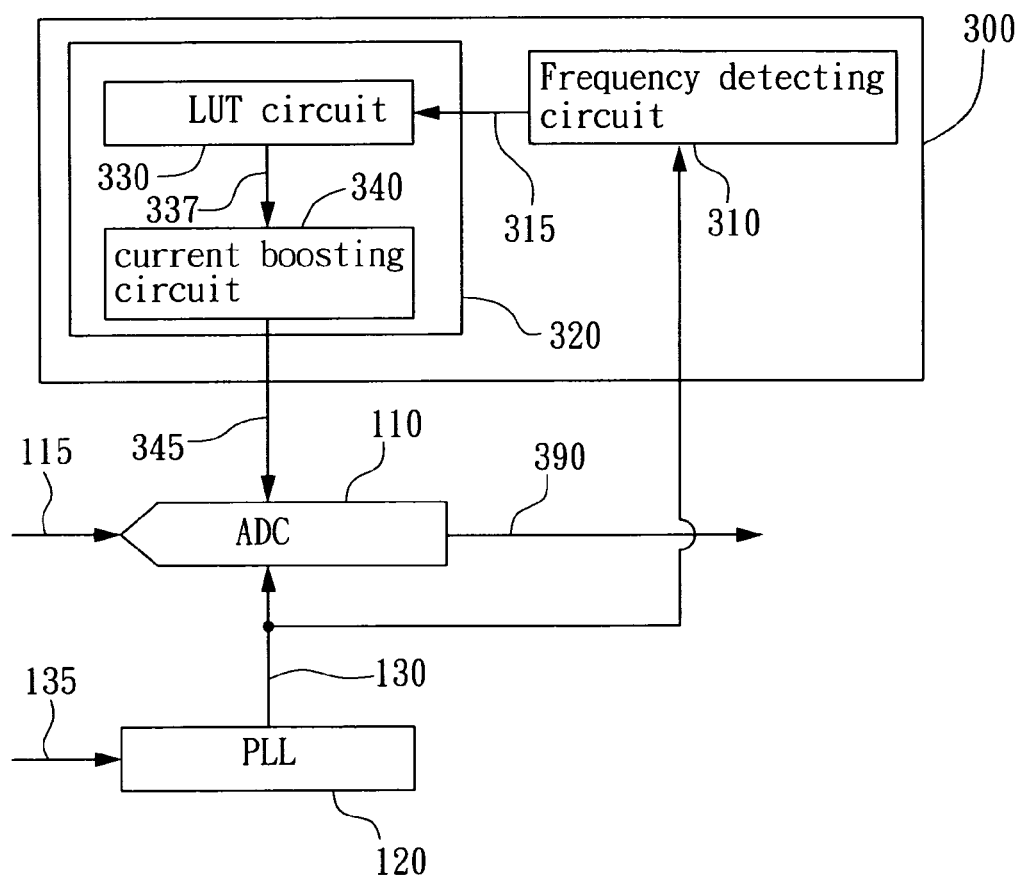
FIG. 3A shows a block diagram of a device for dynamically accelerating an ADC according to one embodiment of the present invention.

Please refer to FIG. 3A, which shows a block diagram of a device for dynamically accelerating an ADC according to one embodiment of the present invention. The device comprises a frequency detecting circuit 310 and a control unit 320. The frequency detecting circuit 310 detects a frequency of a clock signal 130 from a phase-locked loop (PLL) 120 and outputting a detection signal 315 to the control unit 320.

In one embodiment of the present invention, the control unit 320 comprises a look-up table (LUT) circuit 330 and a current boosting circuit 340. The LUT circuit 330 receives the detection signal 315 from the frequency detecting circuit 310 and utilizes a look-up table (LUT) to determine whether the maximum conversion rate of the ADC 110 is larger than or equal to said sampling frequency. The LUT circuit 330 performs table lookup through the LUT to output a control signal 337 to the current boosting circuit 340, which outputs a current 345 into the ADC 110 such that the maximum conversion rate of the ADC 110 is larger than or equal to the sampling frequency.

Figure 3B:
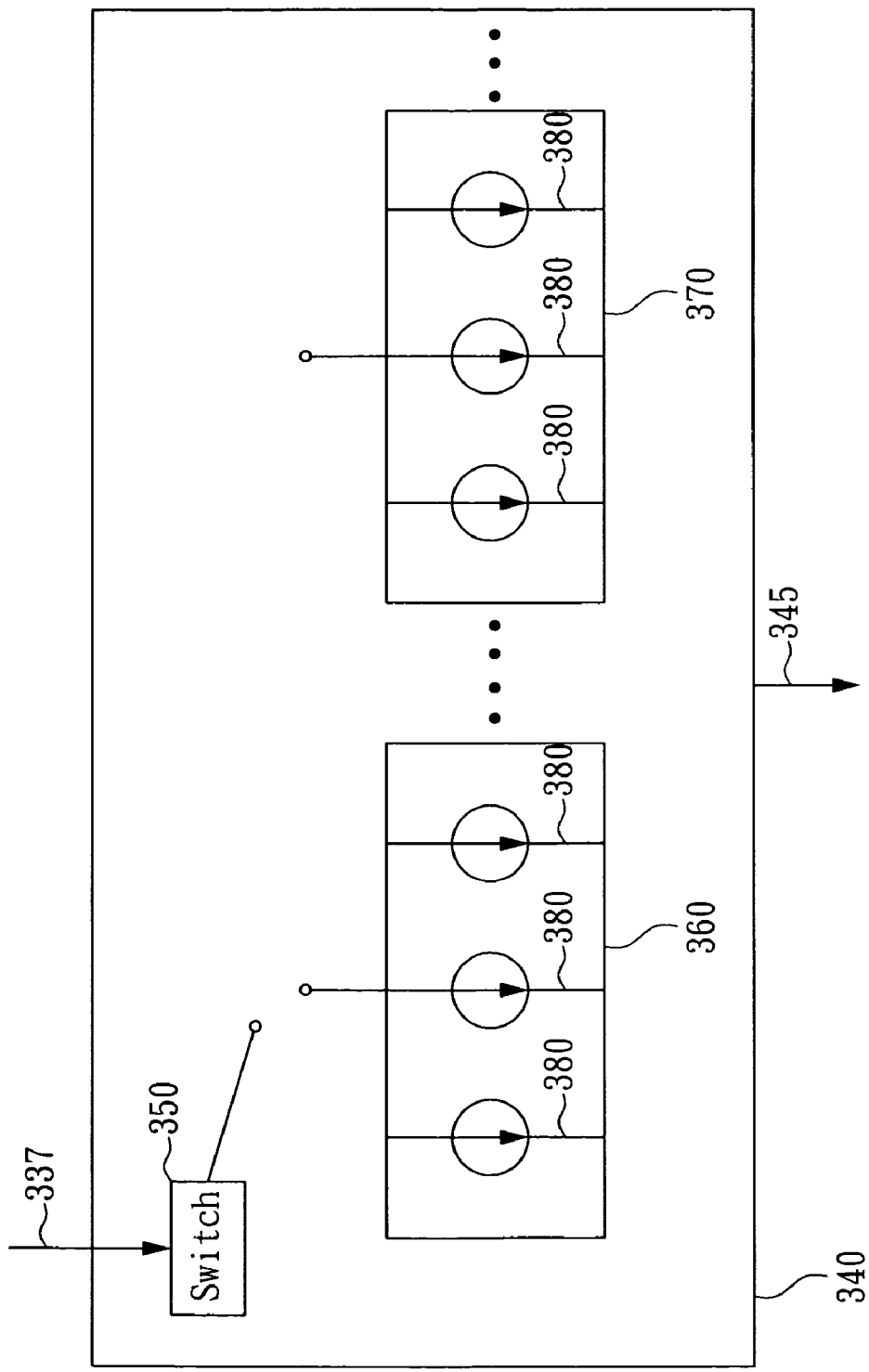
FIG. 3B shows a current boosting circuit of the device in FIG. 3A.

FIG. 3B shows a current boosting circuit of the device in FIG. 3A. The current boosting circuit 340 comprises a switch 350 and a plurality of shunt current sources 360, 370, . . . etc. Each of the shunt current sources 360, 370 comprises a current outlet coupled to the ADC so as to output a sub-current into the ADC. The sub-current from each of the shunt current sources is different. Preferably, each of the shunt current sources 360, 370 comprises different quantity of sub-current sources 380. The shunt current sources 360 and 370 provide different sub-currents to the ADC, thus resulting in different slew rates. The switch 350 receives the control signal 337 and determines whether each of the shunt current sources 360, 370 is to output the sub-current. Therefore, the current boosting circuit 340 can generate the current 345 with various current values to the ADC.

Figure 4:
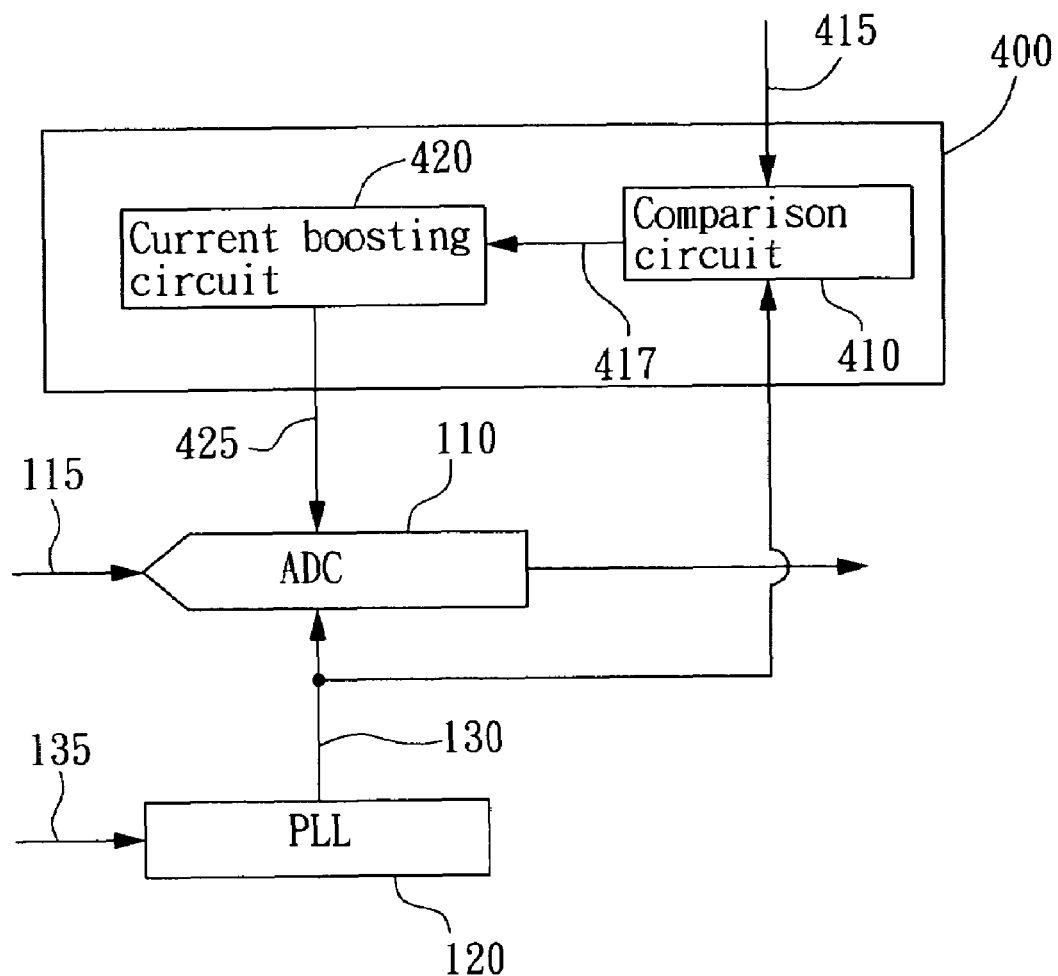
FIG. 4 shows a block diagram of a device for dynamically accelerating an ADC according to another embodiment of the present invention.

FIG. 4 shows a block diagram of a device for dynamically accelerating an ADC according to another embodiment of the present invention. In FIG. 4, the device 400 comprises a comparison circuit 410 and a current boosting circuit 420. The comparison circuit 410 receives the clock signal 130 from the a phase-locked loop (PLL) 120 and a reference signal 415 so as to compare frequencies of the clock signal 130 and the reference signal 415. Therefore, whether the frequency of the clock signal 130 is smaller than that of the reference signal 415 or not is determined. Moreover, the comparison circuit 410 outputs a control signal 417 to the current boosting circuit 420 so as to control and output the current 425 with proper current magnitude to the ADC 110.

It is apparent that the present invention discloses a method and a device for dynamically accelerating an analog-to-digital converter (ADC) by detecting the sampling frequency and controlling the maximum conversion rate so as to optimize the efficiency of the ADC. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for dynamically accelerating an analog-to-digital converter (ADC), said method comprising steps of:
    receiving a horizontal synchronization (H-sync) signal by a phase-locked loop (PLL) so as to generate a clock signal;
    detecting a sampling frequency of said clock signal;
    determining whether a maximum conversion rate of said ADC is larger than or equal to said sampling frequency; and
    increasing a slew rate of said ADC when said maximum conversion rate is smaller than said sampling frequency such that said maximum conversion rate is increased to be larger than or equal to said sampling frequency,
    wherein the determining step determines whether said maximum conversion rate is larger than or equal to said sampling frequency by using a look-up table (LUT).

2. The method as recited in claim 1, wherein said slew rate is increased by boosting a current of said ADC.

3. The method as recited in claim 1, wherein said slew rate is increased by switching to at least one of a plurality of shunt current sources so as to adjust a current of said ADC and control said slew rate.

4. A device for dynamically accelerating an analog-to-digital converter (ADC), wherein a sampling frequency of said ADC is controlled by a clock signal generated by a phase-locked loop (PLL) receiving a horizontal synchronization (H-sync) signal, said device comprising:
    a frequency detecting circuit for detecting a frequency of said clock signal and outputting a detection signal; and
    a control unit for outputting a current into said ADC in response to said detection signal,
    wherein said control unit comprises:
    a look-up table (LUT) circuit for receiving said detection signal and outputting a control signal according to a look-up table (LUT); and
    a current boosting circuit for receiving said control signal and outputting said current into said ADC.

5. The device as recited in claim 4, wherein said current boosting circuit comprises:
    a plurality of shunt current sources, each comprising a current outlet coupled to said ADC; and
    a switch for receiving said control signal and determining whether each of said plurality of shunt current sources is to output a sub-current into said ADC.

6. The device as recited in claim 5, wherein said sub-current from each of said plurality of shunt current sources has a predetermined ratio relationship with one another.

7. A device for dynamically accelerating an analog-to-digital converter (ADC), wherein a sampling frequency of said ADC is controlled by a clock signal generated by a phase-locked loop (PLL) receiving a horizontal synchronization (H-sync) signal, said device comprising:
  a comparison circuit for receiving said clock signal and a reference signal so as to compare frequencies of said clock signal and said reference signal and output a control signal; and
  a current boosting circuit for receiving said control signal and outputting a current into said ADC, wherein said current boosting circuit comprises:
  a plurality of shunt current sources, each comprising a current outlet coupled to said ADC; and
  a switch for receiving said control signal and determining whether each of said plurality of shunt current sources is to output a sub-current into said ADC.

8. The device as recited in claim 7, wherein said sub-current from each of said plurality of shunt current sources has a predetermined ratio relationship with one another.

* * * * *